(12) United States Patent
Agarwal et al.

(10) Patent No.: US 6,477,669 B1
(45) Date of Patent: Nov. 5, 2002

(54) METHOD AND APPARATUS FOR ADAPTIVE CONTROL OF FORWARD ERROR CORRECTION CODES

(75) Inventors: Anil K. Agarwal, Gaithersburg, MD (US); Dattakumar M. Chitre, Silver Spring, MD (US)

(73) Assignee: Comsat Corporation, Bethesda, MD (US)

( * ) Notice: Subject to any disclaimer, the term of this patent is extended or adjusted under 35 U.S.C. 154(b) by 0 days.

(21) Appl. No.: 09/462,893

(22) PCT Filed: Jul. 15, 1998

(86) PCT No.: PCT/US98/14193

§ 371 (c)(1),
(2), (4) Date: Jan. 18, 2000

(87) PCT Pub. No.: WO99/04338

PCT Pub. Date: Jan. 28, 1999

Related U.S. Application Data (60) Provisional application No. 60/052,539, filed on Jul. 15, 1997.

(51) Int. Cl.[7] .............................................. H03M 13/35
(52) U.S. Cl. ....................................... 714/708; 714/774
(58) Field of Search .................................. 714/708, 774

(56) References Cited

U.S. PATENT DOCUMENTS

| | | | | |
|---|---|---|---|---|
| 4,882,733 A | | 11/1989 | Tanner | 371/43 |
| 5,289,473 A | | 2/1994 | Nguyen | 371/5.1 |
| 5,533,004 A | * | 7/1996 | Jasper et al. | 370/204 |
| 5,546,411 A | * | 8/1996 | Leitch et al. | 455/67.3 |
| 5,600,663 A | * | 2/1997 | Ayanoglu et al. | 714/751 |
| 5,638,384 A | | 6/1997 | Hayashi et al. | 371/37.1 |
| 5,699,365 A | * | 12/1997 | Klayman et al. | 714/708 |
| 5,699,369 A | | 12/1997 | Guha | 371/41 |
| 5,729,557 A | | 3/1998 | Gardner et al. | 371/41 |
| 5,828,677 A | * | 10/1998 | Sayeed et al. | 714/708 |
| 5,940,439 A | * | 8/1999 | Kleider et al. | 375/225 |
| 5,983,383 A | * | 11/1999 | Wolf | 714/755 |
| 6,070,074 A | * | 5/2000 | Perahia et al. | 370/318 |
| 6,084,919 A | * | 7/2000 | Kleider et al. | 375/285 |
| 6,138,261 A | * | 10/2000 | Wilcoxson et al. | 370/307 |

* cited by examiner

Primary Examiner—Stephen M. Baker
(74) Attorney, Agent, or Firm—Sughrue Mion, PLLC (57) ABSTRACT

A method for adaptive control of a forward error correction code for transmission between a terrestrial cell/packet switch at a first terminal and a satellite/wireless network connecting to a second terminal, including the steps of: calculating a byte error rate associated with communication signals received by the first terminal, determining a forward error correction code length based on the byte error rate, and transmitting the forward error correction code length to the second terminal.

20 Claims, 7 Drawing Sheets

| CODE INDEX | CODE TABLE INVERSE BER VALUE | REED-SOLOMON CODE LENGTH |
|---|---|---|
| 17 | 715827880 | 2 |
| 16 | 562241498 | 4 |
| 15 | 20133667 | 4 |
| 14 | 6636252 | 6 |
| 13 | 1078755 | 6 |
| 12 | 635218 | 8 |
| 11 | 219936 | 8 |
| 10 | 154438 | 10 |
| 9 | 69463 | 10 |
| 8 | 53221 | 12 |
| 7 | 29402 | 12 |
| 6 | 24125 | 14 |
| 5 | 14790 | 14 |
| 4 | 12779 | 16 |
| 3 | 8859 | 16 |
| 2 | 7841 | 18 |
| 1 | 5782 | 18 |
| 0 | 5224 | 20 |

METHOD AND APPARATUS FOR ADAPTIVE CONTROL OF FORWARD ERROR CORRECTION CODES

The present application is based on U.S. provisional application Ser. No. 60/052,359 filed on Jul. 15, 1997 and priority therefrom is claimed under 35 U.S.C. §120. The entire content of Provisional Application Ser. No. 60-052,359 is incorporated herein by reference.

FIELD OF THE INVENTION

The present invention relates to the efficient and reliable transmission of packet or cell-based information, such as frame relay, SS#7, ISDN, Internet or asynchronous transfer mode (ATM) based information, via wireless links. More specifically, the present invention relates to a method and apparatus for the adaptive control of forward error correction codes associated with cell-based ATM formatted data and packet-based frame relay, SS#7, ISDN and Internet-formatted data for transmission over communication channels. While the present invention is applicable all of the foregoing types of transmission formats, the ATM format will be the exemplary focus of one preferred embodiment for purposes of providing an enabling disclosure, written description and best mode for the present invention.

BACKGROUND OF THE INVENTION

There are a variety of methods for transmitting information via a broadband Integrated Services Digital Network (B-ISDN), using a variety of protocols related to Asynchronous Transport Mode (ATM), frame relay mode, ISDN, Internet and SS#7 modes of transmission. The ATM mode, as the exemplary preferred embodiment, was originally investigated by a group called the International Telephone and Telegraph Consultative Committee (CCITT). The group, currently called the International Telecommunication Union-Telecommunications Standards Sector (ITU-TSS), investigated a new form of ISDN that would have the flexibility to accommodate a large number of channels and the ability to transfer large amounts of data at a very fast rate. At the end of the study, the committee decided to adopt ATM as the target transfer mode for the B-ISDN. The ITU-TSS is currently defining the wide area network (WAN) standards for ATM.

ATM is a transfer mode that sends 53 octet packets (also known as cells) of information across a network from one communication device to another. The 53 octets are comprised of 48 octets of data information, referred to as the payload, and 5 octets of header information (including the routing information). The header and data information must be organized into cells so that when the cells are filled, they can be sent when an open slot of 53 octets becomes available.

Although ATM based transmission, switching, and network technology has been employed in broadband integrated services digital networks (B-ISDN) which rely on fiber optics, there are numerous difficulties associated with implementing ATM based technology in a wireless communication network. These difficulties include the fact that ATM based networks and switches rely on a number of high speed interfaces. These high-speed standard interfaces include OC-3 (155 Mbit/s), OC-12 (622 Mbit/s) and DS3 (45 Mbit/s). However, a few ATM based networks and switches support lower speed interfaces, such as T1 (1.544 Mbit/s) and the programmable rate RS-449 interface.

As a consequence, there are only a few interfaces which can support the comparatively low transmission rates (less than 1 Mbit/s to 8 Mbit/s) used in wireless communication. Although commercial satellite and wireless modems support these low transmission rates using an RS-449 programmable rate interface, it is difficult to implement ATM based technology in a wireless environment using conventional interfaces because most ATM traffic is transmitted over high rate data interfaces.

Another difficulty associated with implementing ATM based technology in a wireless communication network has to do with the fact that ATM based protocols rely on extremely low bit error ratios which are typical of fiber optics based networks. By way of example, ATM protocols assume that the transmission medium has very low Byte Error Ratios (BER) ($10^{-12}$) and that bit errors occur randomly.

In contrast, the bit error ratios associated with wireless communication are much higher (on the order of $10^{-3}$ to $10^{-8}$) and tend to fluctuate in accordance with atmospheric conditions. In addition, the errors associated with wireless communication tend to occur in longer bursts. Thus, a robust error correction scheme must be employed in a wireless network in which ATM based technology is to be implemented.

In addition to the difficulties discussed above, there is another significant constraint placed on wireless communication networks which is not imposed on terrestrial based fiber optics networks. This constraint has to do with the fact that the cost of bandwidth in a wireless network is much higher than for fiber optics networks. As a consequence of having been traditionally implemented in fiber optics networks, ATM based technology is not particularly efficient in its use of transmission bandwidth. Therefore, if ATM based technology is to be implemented in wireless networks, it must achieve a more efficient use of bandwidth.

Traditionally, wireless and satellite communication systems used Forward Error Correction (FEC) Codes, such as Viterbi codes and Reed-Solomon codes, to improve the bit error characteristics of wireless and satellite links because such links are inherently noisy. The quality of wireless or satellite links vary with atmospheric conditions such as rain, fog and snow.

One problem with the use of FEC codes is that they reduce the available bandwidth by a certain percentage. The magnitude of the reduction depends on the particular code selected and the rate of the code. By way of example, a rate ½ Viterbi code consumes 50% of the available bandwidth. Often, the codes are selected for a given link based on a worst case scenario and are fixed for the link. Although fixed coding simplifies the design and implementation of a particular error correction scheme, it results in a severe loss of available bandwidth.

Other primary access interfaces that confront the same problem include the "frame relay" system (for LAN interconnection and Internet access) using TCP/IP or other LAN protocols (ISDN and SS#7) and Internet protocols. Considerations similar to those for ATM are relevant to the transmission of traffic using these other interfaces, as exemplified by the transmission of frame relay, ISDN/SS#7 and Internet traffic over satellite/wireless networks, although some differences are known in the art.

For example, unlike ATM cells, the frame relay, ISDN/SS#7 and Internet use packets that are variable lengths. Thus, the frame formats used to communicate between the satellite/wireless terminals are arranged to transport variable length packets efficiently.

As explained in the Provisional Application Ser. No. 60-052,359, which is incorporated herein by reference, the frame relay system uses a robust, flexible frame format between two communicating terminals which allows the transport of several variable sized Spackets (segmented packets) in a frame and also allows a single Spacket to be carried over several frames, whichever the case might be. Also, the frame format allows fast synchronization and the exchange of coding information. Each frame contains Reed-Solomon (RS) check bytes that are used for error correction and to enhance the quality of the satellite/wireless link. The number of RS check bytes in a frame can be changed on the fly, without any loss of data, to compensate for varying link conditions. The decision to change the RS check bytes in a frame is based on the constant monitoring of the link quality. Several frames are also interleaved before transmission over the satellite/wireless link, to help spread the effect of burst errors over several frames, all of which can then be corrected by the FEC in the frames.

Also, Virtual Channels (VCs) can be configured to be enabled for data compression, which means that the Spackets belonging to the VC are passed through a data compressor/decompressor combination to save bandwidth. VCs can also be configured to be either high or low priority VCs and the scheduler then, uses this information to fairly transmit the various Spackets over the satellite/wireless link. To minimize the large delays introduced by the transmission of low priority packets on a low bit rate link, and the delay experienced by high priority packets which are waiting to be scheduled, the Spacket allows the segmentation of large packets into several, smaller Spackets. The delays experienced by high priority packets are substantially reduced. This also allows for efficient implementation of the compression and decompression modules.

The frame relay arrangement using Spackets also faces the problem of efficiently using bandwidth in a wireless network. Therefore, if frame relay (Spacket)-based technology is to be implemented in wireless networks, it must achieve a more efficient use of bandwidth. These same goals apply to ISDN/SS#7 transmissions and those generally using TCP/IP protocols. However, no solution to problems blocking achievement of these goals is seen in the prior art.

U.S. Pat. No. 5,568,482 relates to a low speed radio link system and method designed for ATM transport. The system is based on a data protocol which is compatible with non-wireless ATM based data transmission systems. The data protocol incorporates a frame format which allows for the transmission of ATM cells in low speed, high noise links. However, the data protocol is rigid and does not account for partial or compressed cells. Similarly, the reference fails to accommodate flexible data payloads or flexible forward error correction codes for error correction.

SUMMARY OF THE INVENTION

The present invention overcomes the above-mentioned problems associated with implementing cell- or packet-based technology in a wireless communication network by providing a method for the adaptive control of forward error correction codes for transmission over communication channels.

Advantageously, the adaptive coding scheme of the present invention provides improved throughput over a wide range of atmospheric conditions by adaptively controlling the forward error correction code. The inventive adaptive coding scheme is well suited to cell or packet transfer, particularly ATM-, frame relay-, Internet- and ISDN/SS#7-based technologies.

According to the present invention, the inventive adaptive scheme may be incorporated in a primary interface as a method for the adaptive control of a forward error correction code for transmission over a communication channel which connects the primary interface to a remote interface.

The inventive method includes the steps of calculating a byte error rate associated with communication signals received by the primary interface via the communication channel from the remote interface and determining a forward error correction code length of the forward error correction code based on the byte error rate. The forward error correction code length is varied in accordance with said byte error rate. The method also includes the step of transmitting the forward error correction code length to a remote interface over the communication channel.

Advantageously, the forward error correction code may, be a Reed-Solomon Code and/or Viterbi code. In addition, the communication channel may be a satellite or wireless communication channel.

According to the present invention, an apparatus is also provided in a primary interface for the adaptive control of a forward error correction code for transmission over a communication channel which connects the primary interface to a remote interface.

The apparatus includes means for calculating a byte error rate associated with communication signals received by the primary interface via the communication channel from the remote interface and means for determining a forward error correction code length of the forward error correction code based on the byte error rate. The forward error correction code length is varied in accordance with the byte error rate.

The apparatus also includes means for transmitting the forward error correction code length to a remote interface over the communication channel.

As used herein, the term "cell" or "packet" shall be used interchangeably to mean both a fixed size cell, such as the ATM cell, and a variable size packet, such as the Spacket, defined to represent all or a portion of a frame relay packet.

BRIEF DESCRIPTION OF THE DRAWINGS

These and other features, aspects and advantages of the present invention will become better understood with reference to the following description, appended claims, and accompanying drawings, in which:

DETAILED DESCRIPTION OF THE PREFERRED EMBODIMENTS

In a preferred embodiment as disclosed herein, the subject matter of the present invention is embodied in one aspect of an ATM-based technology that is incorporated into an interface between conventional ATM-based technology and a wireless communication network. The interface facilitates the transmission of ATM-based traffic in a wireless communication network. However, the interface may also facilitate the transmission of ATM-based traffic over a terrestrial based network. Such interface is referred to as an ATM Link Accelerator (ALA). However, one of ordinary skill in the related art would recognize that similar structures would be applicable to frame relay, ISDN and other cell- or packet-based transmission systems.

The present invention is directed to a method and apparatus for the adaptive control of forward error correction codes transmitted over communication channels. Advantageously, as seen in the description of the preferred embodiment, the forward error correction codes may be associated with ATM-based formatted data. The subject matter of the present invention encompasses one aspect of an ATM-based technology that was developed and incorporated into the ALA interface between conventional ATM-based technology and a wireless communication network. The ALA interface was developed in order to facilitate the transmission of ATM-based traffic in a wireless communication network. However, the interface may also facilitate the transmission of ATM-based traffic over a terrestrial based network. The above-mentioned interface is referred to as an ATM Link Accelerator (ALA).

Figure 1A:
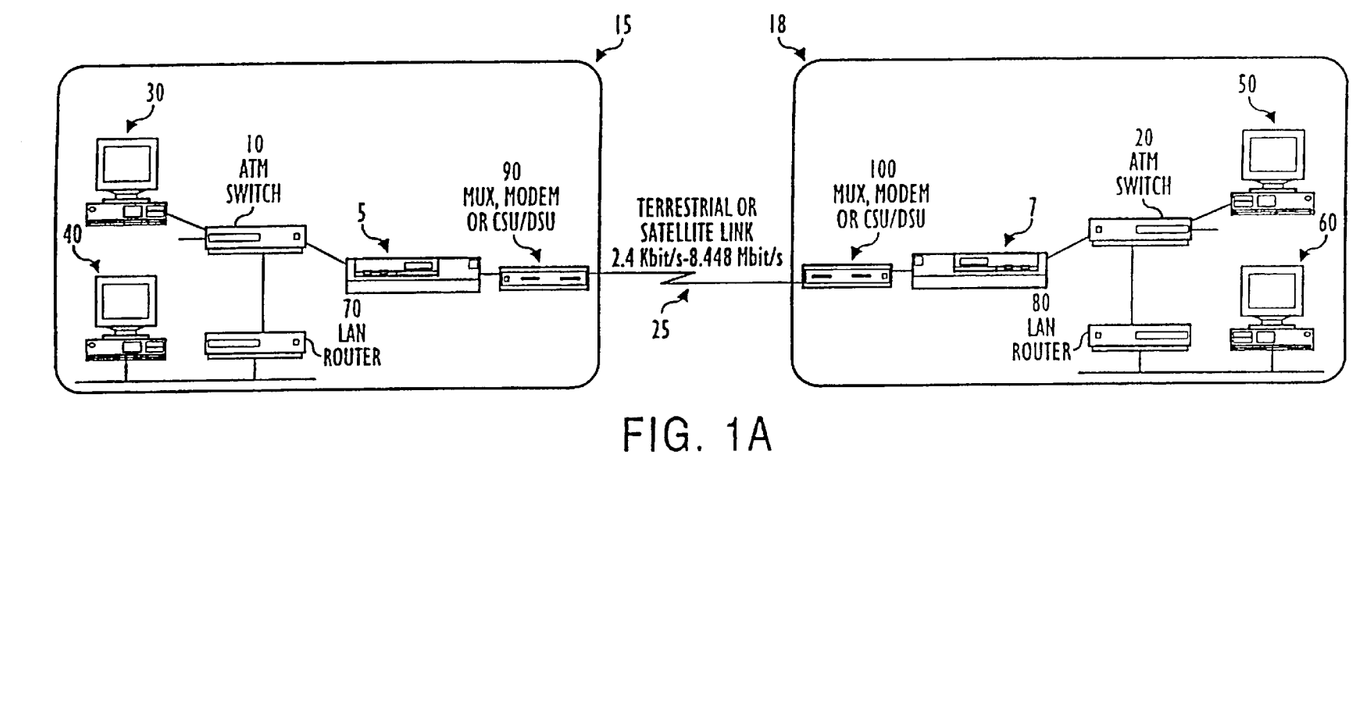
FIG. 1A shows an interface which implements the present invention.

FIG. 1A depicts interfaces 5 and 7 which each provide a means of interconnecting standard ATM switches 10 and 20 over a terrestrial or satellite link 25 in order to provide high quality service for ATM-based applications and to provide an efficient use of transmission link bandwidth.

The ATM switches 10 and 20 may be incorporated into local area networks 15 and 18 which include computers 30, 40, 50 and 60, and LAN routers 70 and 80. The interfaces 5 and 7 may connect to the terrestrial or satellite link 25 via modems 90 and 100 which implement the RS-449 programmable rate interface discussed above. Alternatively, a multiplexer, a channel service unite (CSU) or a digital service unit (DSU) may be used instead of a modem.

Figure 1B:
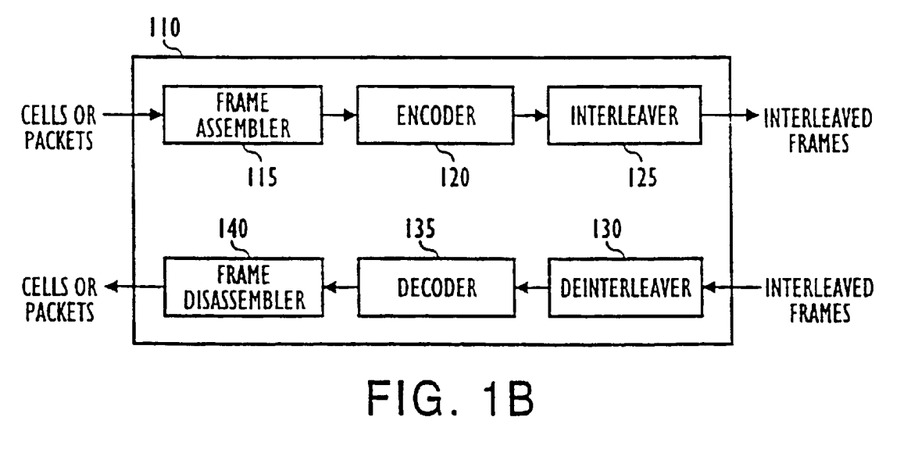
FIG. 1B shows a portion of an interface corresponding to the present invention.

FIG. 1B shows a portion of an interface 110 related to the present invention. The portion 110 includes a frame assembler 115 which forms the frames of a communication signal in accordance with a specific format, an encoder 120 which generates a forward error correction code (i.e. block code) that is included in each frame for error correction of that frame, and an interleaver 125 which interleaves a group of individual frames in order to spread a burst of errors across each frame.

The interface 110 also includes a deinterleaver 130 which deinterleaves an interleaved frame received across a transmission link in order to provide a group of individual frames, a decoder 135 which decodes the forward error correction code of each frame in order to provide error correction for that frame, and a frame disassembler 140 which disassembles a frame into its constituent parts, which may for example include ATM-based cells or packets of compressed ATM cells.

Advantageously, the header and data portions of each cell may be compressed so as to increase the effective bandwidth of the wireless communication link. Each frame can be efficiently packed with ATM cells and/or variable size packets which may be made up of compressed ATM cells. In addition, a portion of an ATM cell or variable size packet may be included in a frame for optimal efficiency.

The frames are subsequently encoded in order to provide for error correction. According to the present invention, adaptive coding is employed in order to determine the proper amount of forward error-correction on a real-time basis in accordance with the number of bit errors detected in the receive link. Thus, if the quality of the received information is high, reduced bits can be allocated for data correction.

In this manner, the right amount of coding can be selected for the measured link quality and this information can be conveyed to a remote interface continuously. Once the remote interface receives this information, it can change the frame format to include fewer or more coding bytes as necessary for all subsequently transmitted frames.

The adaptive coding scheme of the present invention is well suited for satellite and wireless communication. However, the present invention is equally applicable with respect to terrestrial based communication. The inventive adaptive coding scheme is described in detail below.

An exemplary frame format including a forward error correction code which may be adaptively controlled in accordance with the present invention will now be discussed with reference to FIG. 2. Each frame 200 shown in FIG. 2 corresponds to a fundamental unit of transmission over the WAN link. Each frame 200 is also a fixed size frame, which is n octets long.

If interleaving is utilized then I frames are used to compose an "interleaved frame" 210. The interleaving technique rearranges the order of the bytes in the interleaved frame and transmits each byte sequentially over a WAN link. However, there are no special synchronization bits employed within the frame structure.

Figure 2:
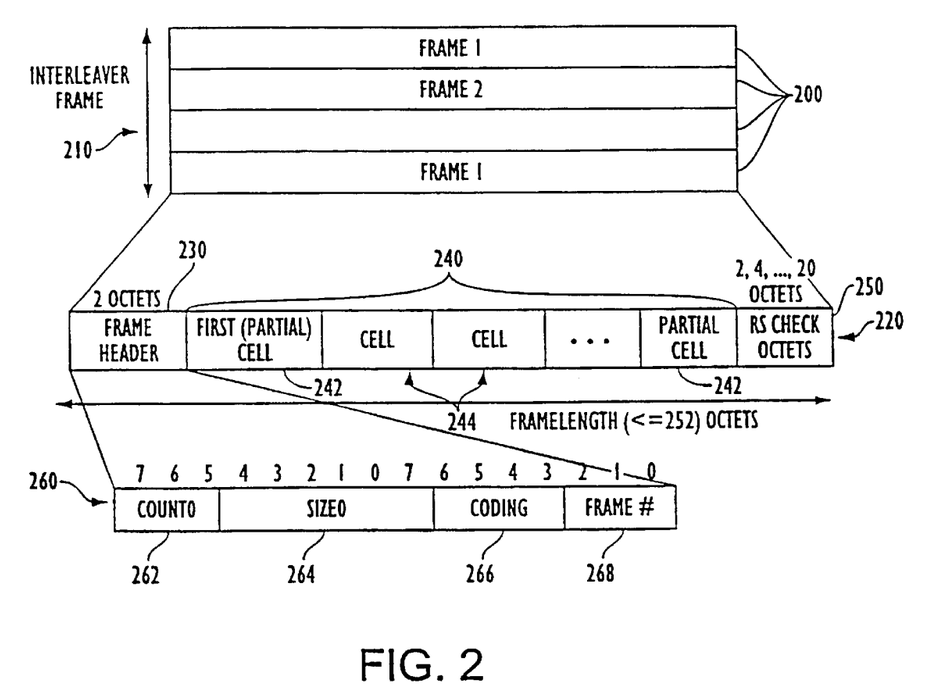
FIG. 2 shows an exemplary frame format including a forward error correction code which may be adaptively controlled in accordance with the present invention.

An exemplary frame 220 is n bytes long and includes a frame header 230, a data payload 240, and a forward error correction code 250, as shown in FIG. 2. The header 230 is two octets long. The data payload 240 has a variable length which depends on the size of the forward error correction code 250. As noted above, the data payload 240 may contain a combination of partial or complete fixed-sized ATM cells 242 and 244 and variable-size packets (the packets, which are not shown, may contain one or more compressed ATM cells or some other data).

The forward error correction code 250 has a length which corresponds to a multiple of octets (e.g. forward error correction coding length=2t, t>0). Advantageously, Reed-Solomon coding check-bytes may be provided as the block code 250. However, other forms of forward error correction may be employed, such as Viterbi coding.

Reed-Solomon coding is discussed in detail in the article, "The Application of Error Control to Communications", *IEEE Communications Magazine,* E. Berlecamp et al., vol. 25, no. 4, April 1987, pages 44–57, which is incorporated herein by reference.

The above-mentioned frame header 230 is made up of a number of fields. An exemplary frame header 260 includes first through fourth fields 262, 264, 266 and 268. The first field 262 contains the variable COUNT which defines the number of complete ATM cells in a frame, including any partial ATM cell which follows the complete ATM cells. The second field 264 contains the variable SIZE which defines the space within the data payload that is allocated for a first partial ATM cell to be contained therein. By way of example, the variable SIZE may be set equal to the number of octets reserved for the first partial ATM cell divided by four.

A third field 266 contains the variable FRAMENUM which defines the frame number. Frame numbers may range from 0–7 and repeat periodically.

Finally, a fourth field 268 contains a variable CODING which defines aspects of the corresponding forward error correction code 250 based on the frame number. By way of example, if the value of FRAMENUM is equal to zero, then the fourth field 268 (or coding field) represents a suggested value of the number of octets which are to be reserved for the forward error correction code 250.

As noted above, the forward error correction code 250 may be generated in accordance with Reed-Solomon Coding. Alternatively, the forward error correction code 250 may also be generated based on Viterbi coding. If Reed-Solomon coding is employed, then the coding field 268 of the frame header included in frame number 0 represents a suggested value of the number of Reed-Solomon octets divided by two that the receiving interface should employ for its own transmissions.

Reed-Solomon coding is implemented in the form of check-bytes which are generated by a standard Reed-Solomon algorithm based on the size of the frame in bytes and the number of check-bytes to be included within the corresponding frame.

If the receiving interface is not yet synchronized to its receiving bit stream, the coding field 268 is set to a predetermined value (e.g. 0xF). According to the present invention, the coding field 268 cannot assume a value of zero, which corresponds to an invalid value.

If the value of FRAMENUM is equal to 1, then the least significant bit of the coding field 268 is set to 1 to represent the fact that an ATM cell header compression algorithm has been activated. If the value of FRAMENUM is equal to 2 or 3, then the coding field 269 may be set to zero unless Viterbi coding is utilized, as noted below.

If the value of FRAMENUM is greater than 3, then the coding field 268 is set to a number which is a function of the number of forward error correction coding octets that the transmitting interface will use for its own transmissions starting with the next frame numbered zero.

The adaptive coding scheme of the present invention will now be described in greater detail. Advantageously, the adaptive coding scheme takes advantage of the varying quality of a communication link, by varying the forward error correction code to match the actual quality of the communication link.

By way of example, on a clear day, the code length is dynamically reduced in accordance with the inventive adaptive coding scheme so that less bandwidth is consumed by the forward error correction code and more bandwidth is available to user applications. In contrast, on "rainy" days, the code length is increased in accordance with the inventive adaptive coding scheme so as to improve the communication link quality.

The inventive adaptive coding scheme is carried out by algorithms which measure the quality of the communication link in real-time, select the optimal forward error correction code length based on the measured quality and change the forward error correction code length on both sides of the communication link.

The inventive adaptive coding scheme -also incorporates an innovative technique to implement Reed-Solomon code changes in a synchronized manner so that no user data is lost during the changeover process.

According to the inventive adaptive coding scheme, the quality of the incoming communication link is continuously measured at a receiving interface (e.g. ATM Link Accelerator), which will be referred to as the primary interface. However, the measurement is not made until after the receiving interface becomes synchronized with the incoming bit stream transmitted from a remote interface. The measurement of the communication link quality is based on the number of byte errors corrected by a decoder which is included in the interface.

Once the measurement is complete, the primary interface calculates the appropriate amount of forward error correction coding for the measured communication link quality. Subsequently, the primary interface stores the calculated forward error correction code and transmits this information to the remote interface.

After the remote interface receives this information, it transmits signals including a forward error correction code having more or less forward error correction coding bytes in accordance with the information provided by the primary interface. By way of example, the frame format mentioned above in connection with FIG. 2 may be altered to include more or less coding bytes for all subsequent frames which are transmitted from the remote interface.

As noted above, a special synchronization algorithm is employed in connection with the inventive adaptive coding scheme so that the receiving interface can make the corresponding change at the proper time. The synchronization process, ensures that no frames are lost during the changing of forward error correction codes. Because of the need for synchronization, the inventive adaptive coding scheme can only be used with communication links that include a feedback path between two interfaces.

During the time that an interface has not achieved synchronization, it sets the forward error correction code value of its receiver and its transmitter to a maximum value which assumes a worst case scenario (i.e. the communication signals are being transmitted during inclement whether). The boundary within the frame between the payload and the forward error correction code field (see elements 240 and 250 of FIG. 2) is appropriately set to reflect the fact that the forward error correction code has assumed a maximum value.

After the primary interface achieves synchronization, it determines whether the remote ALA has also achieved synchronization. By way of example, the synchronization of the remote interface may be ascertained by evaluating whether the coding field 266 of the frame header 230 of frame number 0 contains a valid code number. If the coding field does contain a valid code number, then the primary interface activates the adaptive coding algorithm as described below.

After both interfaces are synchronized, the primary interface initializes two variables BER, which represents the byte error ratio associated with a communication link, and MINBER, which represents the minimum byte error ratio that an interface will assume is associated with a particular communication link. The bit error ratio is approximately equal to BER divided by eight. By way of example, BER may be set equal to $10^{-3}$, and MINBER may be set equal to $715827880^{-1}$.

Next, the primary interface performs the following computations at a variable interval of, for example, one second. Initially, the primary interface calculates the current byte error ratio (CURRBER) by dividing the total number of corrections made by the forward error correction decoder included in the primary interface during the computational interval (NERRORS) by the total number of bytes received during a computation interval (NBYTES). However, the variable, NERRORS, may not assume a value of zero, as the value of the variable, CURRBER, would then be undefined; thus, in this special case NERRORS should be set to 1 for purpose of calculation if it actually is 0.

It is preferred that the variable, NERRORS, assume at least a first predetermined minimum value prior to calculating the value of the variable, CURRBER. By way of example, the first predetermined minimum value may be eight.

If NERRORS is less than the minimum value, then it is also preferred that the variable, NBYTES, be larger than the lesser of second and third predetermined minimum values. By way of example, the second and third predetermined minimum values may each be a function of one of the variables, BER and MINBER. More specifically, the second predetermined minimum value should be at least $4*BER^{-1}$, whereas the third predetermined minimum value should be at least $2*MINBER^{-1}$.

If the variables, NBYTES and NERRORS, do not assume their corresponding minimum values, then the calculation of the variable, CURRBER, should be delayed until more data can be accumulated.

Once the value of the variable, CURRBER, has been calculated, then the next value of the variable, BER, is calculated. This value will define the size of the suggested forward error correction code that will be transmitted to the remote interface. The next value of the variable, BER, will be determined based on the current values of the variables, BER and CURRBER.

In addition, the next value of the variable, BER, may be calculated in accordance with one of a number of formulas which is selected based on the relative current values of the those same variables, CURRBER and BER. By way of example, if the current value of the variable, CURRBER, is greater than the current value of the variable, BER, then the next value of the variable, BER, will be calculated in accordance with the following formula:

$$BER=4/(BER^{-1}+3*CURRBER^{-1}).$$

Alternatively, if the current value of the variable, CURRBER, is less than a predetermined fraction of the current value of the variable, BER, then the next value of the variable, BER, will be calculated in accordance with the formula:

$$BER=1/(BER^{-1}+32*CURRBER^{-1}).$$

Finally, if the current value of the variable, CURRBER, falls between the predetermined fraction and the current value of the variable, BER, then the next value of the variable, BER, will be calculated in accordance with the following formula:

$$BER=8/(7*BER^{-1}+CURRBER^{-1}).$$

The above formulas for calculating the next value of the variable, BER, can be efficiently implemented in software using integer numbers only by maintaining the inverse value of BER and CURRBER as integer numbers between 1 and $2^{32}$.

According to one aspect of the inventive adaptive coding scheme, the average value of the variable, BER, may be calculated in accordance with the relative values of the variables BER and CURRBER. If the value of the variable, CURRBER, is greater than the current value of the variable, BER, then after the calculation of the next value of the variable, BER, is completed, the average value of the variable, BER, is determined by taking into account only the most recent calculations of the variable, BER.

However, when the value of the variable, CURRBER, is less than a predetermined fraction of the current value of the variable, BER, then after the calculation of the next value of the variable, BER, is completed, the calculation of the average value of the variable, BER, is made by taking into account a greater number of the previous calculations of the variable, BER. In this manner, the inventive adaptive coding scheme can be made to react more quickly to a deteriorating BER or more slowly to an improving BER.

Once the next value of the variable, BER, has been calculated, the appropriate length of the forward error correction code can be selected based on that value. Alternatively, the appropriate length of the forward error correction code can be selected based on the average value of the variable, BER, as discussed above.

If the forward error correction code corresponds to Reed-Solomon coding, then the length of the forward error correction code may be selected by accessing a table including the inverse of BER values and corresponding forward error correction code length values in the manner described below. By way of example, the length of the forward error correction code may be transmitted within the coding field of the formatted frame mentioned above in connection with FIG. 2 when the frame number of the frame is zero. The actual value sent, however, is the length of the forward error correction divided by 2.

Figure 3:
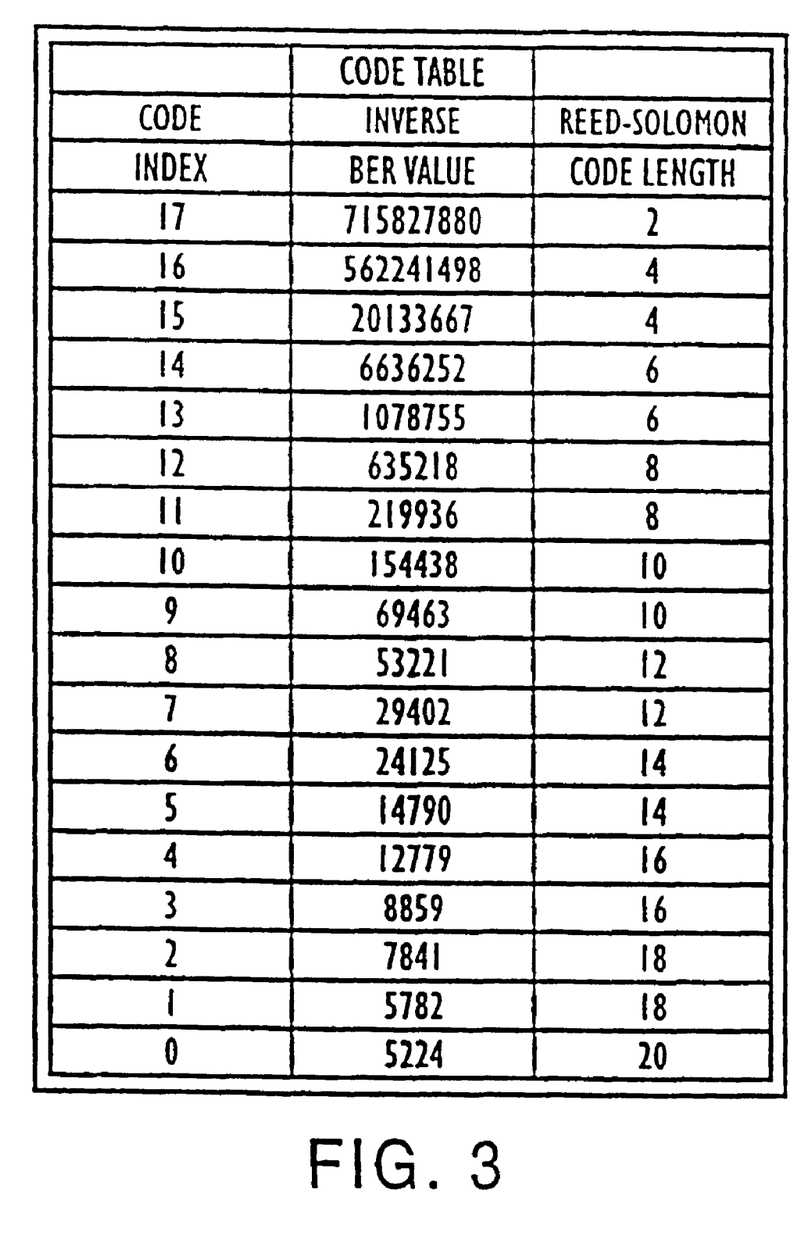
FIG. 3 shows an exemplary table employed in connection with the inventive adaptive coding scheme that contains forward error correction code length values which correspond to the inverse of BER values.

An exemplary table, CODETABLE, is depicted in FIG. 3. Each entry in the CODETABLE has two fields: the inverse of a BER value and the length of the Reed-Solomon code in check-bytes. The CODETABLE is implemented in software as an array having a number of entries equal to a variable, TABLESIZE. The array is indexed by a variable, CODEINDEX, which is set equal to zero.

Initially, the field of the first entry of the array which contains the inverse of a BER value is accessed to see if the inverse of a computed BER value is equal to the inverse of the BER value stored in the array. The variable, CODEINDEX, is then incremented if its value is less than the variable, TABLESIZE, and the inverse of the BER value stored as the next entry of the array is greater than or equal to the inverse of the computed BER value. However, if the variable, CODEINDEX, is greater than zero and the inverse of the BER value stored in the previous entry of the array is less than or equal to the inverse of the computed BER value, then the variable, CODEINDEX, is decreased.

Once the inverse of the computed BER value is matched with the inverse of a BER value stored as an entry in the array corresponding to the value of CODEINDEX, then the corresponding length of the Reed-Solomon code is selected from the table.

The values stored in the CODETABLE have been derived assuming that bit errors are bursty with an average burst length of 64 and a burst error density within a burst of 20%. For random bit error situations, the error introduced by the use of the CODETABLE are small. However, a similar table can be derived and used for alternate scenarios.

The values and the code selection algorithm have been designed so that there is an appropriate amount of hysteresis. Thus, if the value of the inverse of the computed BER fluctuates near a threshold value, the algorithm will not rapidly select alternate values around the threshold value.

Additionally, the values stored in the CODETABLE have been derived so that the net link quality after Reed-Solomon correction is $10^{-10}$. The figure $10^{-10}$ represents the ratio of the ATM cells that are lost due to non-correctable bit errors to the total number of cells. The values stored in the CODETABLE have been derived so that there is a 0.5-decibel amount of "margin" built into the link quality measurement. Thus, even if the link signal to noise ratio drops by 0.5 decibels, the link quality will be maintained at $10^{-10}$. Therefore, the actual quality experienced by applications is better than $10^{-10}$ most of the time. The above mentioned table can be modified for Viterbi coding as well, or for a combination of Viterbi and Reed-Solomon codes. In this regard, the basic algorithm remains the same. However, each entry of the table incorporates forward error correction code length values corresponding to both Viterbi and Reed-Solomon codes along with the inverse BER values.

By way of example, Viterbi codes can be selected which correspond to rate 1, rate ⅞, rate ¾ and rate ½ Viterbi codes. The exact values for each entry in the modified CODETABLE are derived in a manner which is similar to those of the CODETABLE incorporating only Reed-Solomon Code lengths. Although the values for the CODETABLE are not indicated, the first group of (approximately) 20 entries may use a rate 1 Viterbi code. The second group of (approximately) 20 entries may use a rate ⅞ Viterbi code. The third group of (approximately) 20 entries may use a rate ¾ Viterbi code and the fourth group of (approximately) 20 entries may use a rate ½ Viterbi code. Of course, additional groups of Viterbi codes may be added.

It is worthwhile to note that Reed-Solomon code values may not be specified for each Viterbi code rate. If there are Viterbi and Reed-Solomon codes which correspond to the inverse of a computed BER value, then both the Viterbi code value and the Reed-Solomon code values are sent to the remote interface when a new code rate is selected. By way of example, the Viterbi code rate may be sent in the coding field of the frame shown in FIG. 2 when its frame number is 3.

Viterbi code changes may cause the receiving modem to lose data synchronization, which, in turn, leads to a loss of frame synchronization in the corresponding interface. In such a case, the receiving interface shall not change its receive Viterbi and Reed-Solomon code rates for a number of seconds (e.g. 4 seconds) after a Viterbi code change. The transmitting interface shall similarly retain its Viterbi and Reed-Solomon code rates for the same length of time even if it detects that the remote device has lost synchronization. The value of the coding field of every received frame whose frame number is 0 is monitored. If the value contained in the coding field is valid and is different from the value currently being transmitted in frames, then in a next low-number transmitted frame (e.g., one having a frame number of 4–7), the coding field in the frame header will include a new value which corresponds to the Reed-Solomon code length that will be used in future frames starting with the next frame having a frame number of zero.

Figure 5:
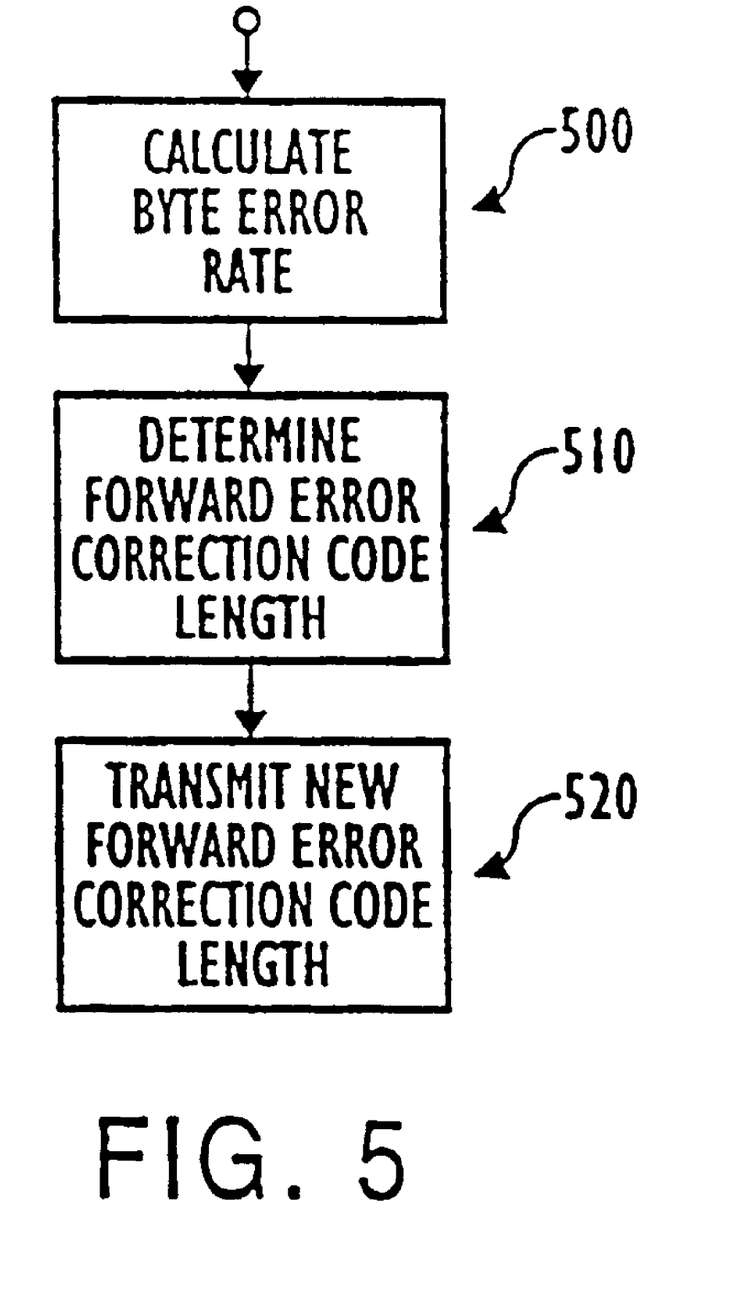
FIG. 5 shows a flow chart diagram including method steps corresponding to the inventive adaptive coding scheme.

The new value of the forward error correction code length or Reed-Solomon code length will be calculated in accordance with the steps shown in FIG. 5.

Figure 4:
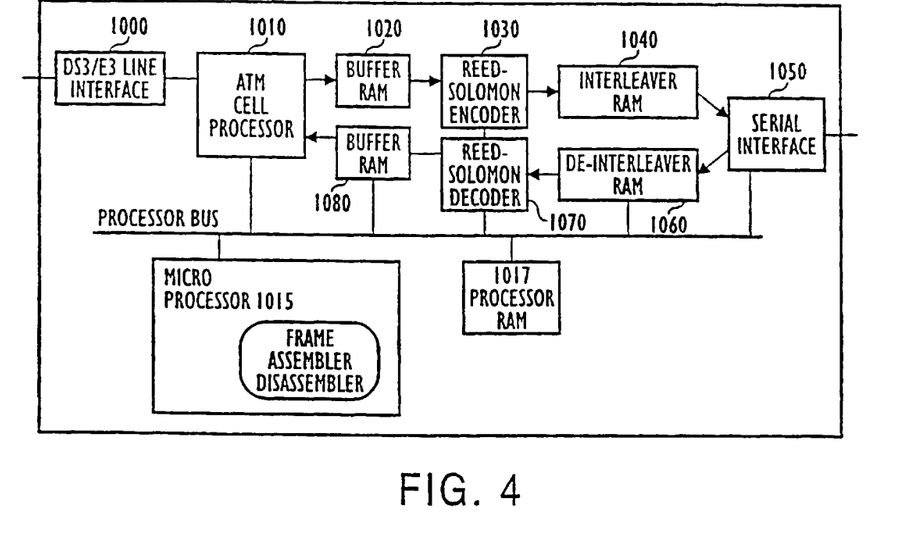
FIG. 4 shows an exemplary apparatus incorporating the adaptive coding scheme of the present invention.

The architecture of a portion of an exemplary primary interface embodying the present invention is discussed below in connection with FIG. 4.

A DSE/E3 Line Interface 1000 receives input data including ATM cells from an ATM switch (not shown). However, another line interface may be used to accommodate alternative standards, such as frame relay and ISDN/SS#7. The ATM cell processor 1010 receives the ATM cells from the interface 1000.

The ATM cell processor 1010 extracts a portion of any ATM cell received in order to determine whether errors are present within the header of the ATM cell. The ATM Cell Processor 1010 then outputs the remainder of any ATM cell (without its error correction portion) to a RAM Buffer 1020 under the control of a Microprocessor 1015 which is employed as the frame assembler of the present invention. A RAM 1017 is provided for the Microprocessor 1015.

The Microprocessor 1015 forms frames in the manner described above. However, the data payload of each frame is stored in the RAM Buffer 1020. In addition, the Microprocessor 1015 appends a frame header to the data payload of each frame. The data payload may also include packets of compressed ATM cells.

Subsequently, the frame header and the data payload of each frame are output from the RAM buffer 1020 to a Reed-Solomon Encoder 1030. The Reed-Solomon Encoder 1030 appends a number of check-bytes to each frame for error correction of the frame at a receiving apparatus.

An Interleaver RAM 1040 receives the output of the Reed-Solomon Encoder 1030 under the control of the Microprocessor 1015 in order to form an interleaved frame in the manner described above. Following the interleaving process, the interleaved frame is output by the Interleaver RAM 1040 to a Serial Interface 1050 for transmission to a receiving apparatus over a WAN via a modem, for example.

Although components of an exemplary primary interface embodying the present invention have been described in connection with the assembly of frames of data, the apparatus is also provided with components which are employed for the disassembly of those frames.

In particular, the exemplary primary interface is provided with a Deinterleaver RAM 1060, which is used to deinterleave an interleaved frame. The deinterleaving operation occurs under the control of the Microprocessor 1015. Once an interleaved frame has been deinterleaved to provide individual frames, each individual frame is sent to a Reed-Solomon Decoder 1070, which removes the Reed-Solomon check-bytes and corrects any bit errors of the frame. However, if the Reed-Solomon Decoder 1070 is unable to correct the frame, then all the data in the frame is discarded.

The Microprocessor 1015, which runs the algorithms associated with the inventive adaptive coding scheme, monitors the value of the coding field of every received frame whose frame number is 0. If the value contained in the coding field is valid and is different from the value currently being transmitted in frames, then in the next transmitted frame having a low frame number (e.g., 4–7), the coding field in the frame header will include a new value which corresponds to the Reed-Solomon code length that will be used in future frames starting with the next frame having a frame number of zero.

The new value of the forward error correction code length or Reed-Solomon code length will be calculated in accordance with the steps shown in FIG. 5.

Initially, in step 500, the Microprocessor 1015 will calculate a byte error rate associated with communication signals received by the primary interface via a communication channel, such as a satellite based WAN, from a remote interface. In step 510, the Microprocessor 1015 determines a forward error correction code length of the forward error correction code based on the byte error rate. The forward error correction code length is varied in accordance with the byte error rate.

Subsequently in step 520, the Microprocessor 1015 controls the primary interface to transmit the new forward error correction code length to the remote interface over the communication channel.

Although frames will still be transmitted with Reed-Solomon codes having old value of the Reed-Solomon code length until the next frame is transmitted having the frame number 7, the next frame having a frame number of 0 and all frames thereafter will be transmitted using the new Reed-Solomon code length.

As an option, the exemplary primary interface transmitting the new value of the forward error correction code length may modify the value received from a remote interface to lie within certain configurable minimum and maximum values prior to implementing any code changes.

Once a frame has been corrected in accordance with a Reed-Solomon code, the corrected frame is output by the Reed-Solomon Decoder 1070 to a RAM Buffer 1080. The Microprocessor 1015, which is also employed as a disassembler of the present invention, disassembles each corrected frame output by the Reed-Solomon Decoder 1070 and separates the data payload of each frame into its individual components (e.g. ATM cells and/or packets) in accordance with information provided in the frame header of the frame. However, any packets included within a frame should be decompressed into ATM cells before any additional processing is carried out.

The ATM cells are then output to the ATM Cell Processor 1010 which appends error correction information to the header of each ATM cell. Thereafter, the ATM cells are output to the Line Interface 1000 from the ATM Cell Processor 1010. The Line Interface 1000 outputs the ATM cells to an ATM switch (not shown).

Although an exemplary primary interface has been discussed above in connection with FIGS. 4 and 5, the primary and remote interfaces are identical. The remote interface will operate the same as the primary interface discussed above with respect to the processing of received communication signals.

While the preferred embodiment of the interfaces are shown for an ATM implementation, it would be understood by one of ordinary skill in the art that the invention can be implemented for other cell- and packet-based systems, such as a frame relay system.

Figure 6A:
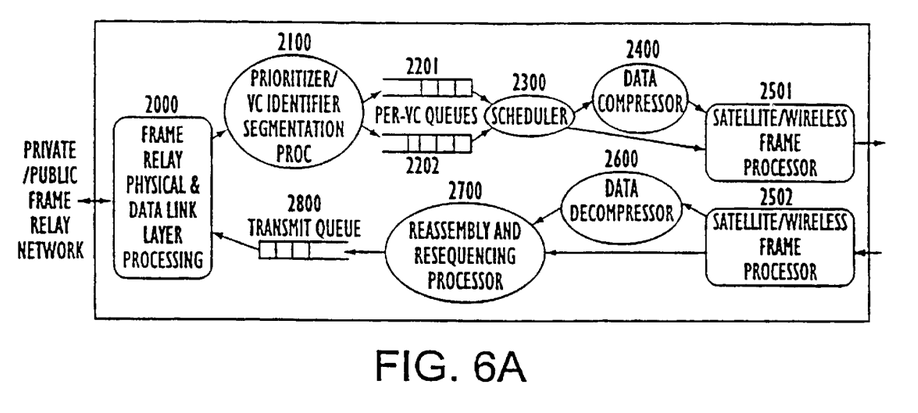
FIG. 6A illustrates a high level arrangement for a frame relay system.

FIG. 6A is a high level description of a frame relay system that performs frame relay processing to efficiently carry frame relay packets over wireless/satellite links. This system can perform the following:

Frame Relay processing at the Physical Layer and the Data Link Layer

Formatting of Data (variable length packets, segmentation and reassembly, resequencing)

Dynamic Forward Error Coding

Interleaving of frames (to spread the effect of burst errors)

Per-VC data compression

Prioritization and Scheduling

Header Compression

In the high level description of the various functions performed in the system seen in FIG. 6A, to the left of the diagram is the private/public frame relay network and to the right is the satellite/wireless link.

The illustrated system uses a robust, flexible frame format between the 2 communicating terminals which allows the transport of several variable sized Spackets (segmented packets) in a frame and also to carry a single Spacket over several frames, whichever the case might be. Also, the frame format allows fast synchronization and the exchange of coding information. Each frame contains Reed-Solomon check bytes that are used for error correction and to enhance the quality of the satellite/wireless link. The number of RS check bytes in a frame can be changed on the fly, without any loss of data, to compensate for varying link conditions. The decision to change the RS check bytes in a frame is based on the constant monitoring of the link quality. Several frames are also interleaved before transmission over the satellite/wireless link, to help spread the effect of burst errors over several frames, all of which can then be corrected by the FEC in the frames. Also, Virtual Channels (VCs) can be configured to be enabled for data compression, which means that the Spackets belonging to the VC are to be passed through a data compressor/decompressor combination to save bandwidth. VCs can also be configured to be either high or low priority VCs and the scheduler then, uses this information to fairly transmit the various Spackets over the satellite/wireless link.

In operation, a private or public frame relay network provides the frame relay packets to the frame relay physical and data link layer processing block 2000, where they are received and processed as specified in ITU recommendation Q.922 (Link Access Procedures for Frame Relay). The physical layer processing is similar to the processing of any HDLC data stream. This is the processing performed in most Frame Relay Access Devices (FRADs).

A frame relay packet received from the terrestrial network consists of payload data and a CRC field, and flags at the beginning and the end of the frame. The frame relay processing removes the flags and the CRC fields and transports only the payload section of the frame relay packet over the satellite link. The CRC and the flag information is regenerated at the receiving terminal and added to the packet before it is transmitted to the receive side terrestrial network.

Figure 6B:
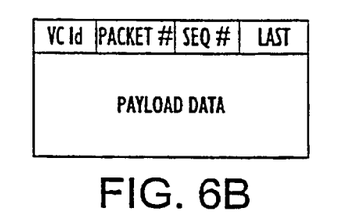
FIG. 6B. illustrates the fields in a Spacket used in a frame relay system.

In prioritizer/VC identifier/Segmentation processor 2100, the variable length frame relay packets are segmented into several smaller packets called Spackets. The Spackets allow efficient scheduling of packets belonging to multiple priorities and loss less data compression. FIG. 6B illustrates the various fields in a Spacket, whose content provides for efficient processing of the Spackets, as subsequently described.

In order to avoid an intolerable delay of high priority packets (e.g., audio and video) due to processing and transmission of low priority packets, Spackets belonging to a high priority packet could be transferred after a single Spacket from a low priority packet has been transferred, thus minimizing the delay variance that the high priority packet experiences. This technique minimizes the delay variance significantly and the satellite/wireless network performance is better than terrestrial networks, as far as delay variance is concerned. Thus, when each frame relay packet is segmented into one or more Spackets, all but the last Spacket are n bytes long. The last Spacket could also be n bytes long if the frame relay packet, to begin with, was of a length which was an integral multiple of n. A Spacket is then prepended with a header as shown in FIG. 6B that contains a Virtual Channel (VC) Identifier for the channel to which the packet belongs. Also, the header is supplied with the packet and the sequence numbers. The packet number increments for each new frame relay packet. The sequence number increments for each Spacket within the frame relay packet. Information about the priority of the packets and whether or not the packets are compressed is maintained locally. All this information is used to perform segmentation/reassembly, data compression/decompression, prioritization and scheduling. The "last field" indicates whether or not the Spacket is the last Spacket for the frame relay packet. If it is, then at the receiving terminal, the frame relay packet can be reassembled and transmitted over the terrestrial link.

The sizes of the various fields can be left to the discretion of the system designer. The VC Id field would either be the size of the entire VC field in the frame relay packet or could be the size specified in the header compression parameters. The size of the Packet number and Sequence number are also left to the system designer. The "last field" is a single bit. The size of the payload is determined by a trade-off between the overheads and the performance of the system.

If the payload size is very low, the overheads will be very high, but the delay variance performance of the system will be very good. If the payload size is set to a large value, then the delay variance performance will be poorer but the overheads will be lower. Hence, the sizes would depend on the overheads the designer is prepared to allow, and the performance specifications of the system.

Next, queues of Spackets belonging to different VCs are stored for use by the scheduler in Per-VC or priority queues 2201 and 2202. In the case of a priority queue, high priority queues 2201 and low priority queues 2201 are maintained and the cells in each priority queue are transmitted on a FIFO basis. A more preferable mode of queuing is to have a queue for each VC, which is designated to have a high or low priority, and then store the cells belonging to each VC in its corresponding queue. Cells in these per-VC queues are also transmitted on a FIFO basis to preserve sequence integrity.

A scheduler 2300 sends Spackets belonging to various priorities or VCs over the satellite link. The scheduler is designed to be fair to VCs within a priority and between priorities as well. If the Spacket is to be compressed then it is sent to the Data Compressor 2400. The scheduler 2300 uses all the priority information for the various VCs and tries to be fair in the scheduling of the Spackets. A simple scheduling algorithm is to process all the high priority per-VC queues on a round-robin basis and then to process all the low priority per-VC queues on a round-robin basis. Another option for the scheduler would be to transmit at least one low priority cell every "n" high priority cells. This could assure some degree of fairness between priorities. A further option would be, within a priority, to use a weighted round-robin scheduling algorithm to transmit cells from per-VC queues, the weights reflecting the bandwidths that the VCs have subscribed for. This scheduling algorithm will attempt to schedule different VCs fairly.

Spackets which belong to a VC which has been specified to be compressed are compressed in data compressor 2400. To achieve loss-less data compression, the compression and decompression histories are reset every n Spackets, where n is a configurable parameter. With the FEC, the link is maintained at a very low BER. If a Spacket does get corrupted, then the resetting of the histories, will ensure that not more than n Spackets are affected.

Figure 6C:
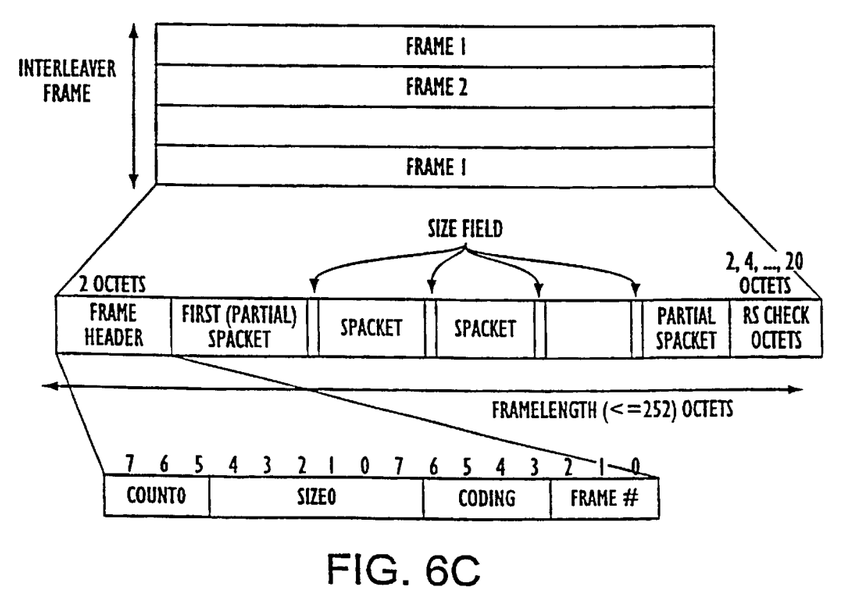
FIG. 6C illustrates a satellite/wireless frame structure that is applicable to a frame relay system.

Finally, the compressed or uncompressed Spackets are provided to a satellite/wireless frame processor 2501, which incorporates the Spackets into a frame for transmission over the satellite/wireless link. This frame structure has been designed to facilitate fast frame synchronization, accommodation of several variable-size packets, fast recovery from lost frames, very low bandwidth overhead, as well as dynamic Reed-Solomon coding change without introducing data loss during the coding rate change transition. FIG. 6C shows the frame format.

The fundamental unit of transmission over the satellite/wireless link is a fixed size frame, which is n octets long. If an interleaving depth of I is used, then I such frames are used to compose an "interleaver frame". The interleaver rearranges the order of the bytes in the interleaver frame and transmits each byte sequentially over the satellite/wireless link. It should be noted that there are no special synchronization bits in this frame structure.

Each frame is n bytes long and consists of:
   a 2-octet header
   followed by the frame payload, and
   terminated by 2t octets (t>0) of Reed-Solomon coding check bytes in the end.

TABLE 1

| | |
|---|---|
| Count0 | Number of Spackets in frame. Does not include the first Spacket, if any Includes the last Spacket, if any |
| Size0 | Size of first partial Spacket in frame divided by 4. |
| FrameNum | The frame number Each frame is sequentially numbered 0, 1, . . . , 7, 0 , . . . |
| Coding | If FrameNum > 3, the coding field represents the number of Reed-Solomon octets/2 that will be used starting with the next frame numbered 0. Note that 0 is an invalid value for the coding field. If FrameNum == 0, the coding field represents the suggested value of the number of Reed-Solomon octets/2 that the other side should use for its own transmission. If the coding field value is 0xF, the value implies that the transmitting terminal is not yet synchronized to its receiving bit stream. Note that 0 is an invalid value for the coding field. If FrameNum == 1, the least significant bit of the coding field is 1 if Spacket header compression is activated at the transmitting terminal, 0 otherwise. Other bits of the field are reserved for future use. If FrameNum is 2 or 3, the coding field shall be set to 0's. |

The payload contains a combination of several variable-size packets (the packets may contain compressed or uncompressed Spackets).

The rules for filling a frame payload with Spackets are as follows:

1. If the previously transmitted frame contained a partial Spacket at the end of the payload, the frame payload currently being transmitted begins with the next portion of that Spacket. This portion shall consume min (4*size0, payload_size) octets of the payload, where size0≧0. The actual size of this partial Spacket may be up to three octets less than 4*size0, in which case the extra octets shall be filled with zeroes.
2. After the initial partial Spacket segment, the payload contains Count0 Spackets where count0≧0. If the last Spacket cannot be entirely contained in the payload, then only its initial portion is included in the payload. Each Spacket is preceded by a 1-octet-length (in octets) field followed by the Spacket contents. The length field contains the size of the Spacket in bytes.
3. If there are any octets left over in the payload, then the first such unused octet shall contain a zero. The rest of the octets, if any, shall be filled sequentially with the numbers i, i+1, i+2, . . . , where i is the octet number of the first such octet in the payload (octets in the payload are implicitly numbered 0, 1, . . . )

From these rules, one can see that a frame payload may contain several Spackets and that the Spackets can be transmitted over more than one frame. A frame with no Spackets contains the sequence 0, 1, 2, . . .in the payload. A Spacket may be split across more than two frames if required.

This frame structure design allows the possibility of dynamically changing the Reed-Solomon code size by correspondingly changing the payload size but keeping the frame size constant. If the receiver "loses" a frame, for example, due to excessive bit errors in the frame, the size0 field allows rapid determination of the Spacket boundary on the very next frame. The frame header, shown in FIG. 6C, has four fields which are described in Table 1, wherein the Reed-Solomon check-bytes are the check-bytes generated by a standard Reed-Solomon algorithm with frame size=N bytes and number of check bytes=2t.

During the time that the system has not achieved receive synchronization, it sets the Reed-Solomon code value of its receiver and its transmitter to the maximum value. After the system achieves receive synchronization and it detects that the remote terminal has also achieved receive synchronization (i.e., the coding field in the received frame header of frame number 0 contains a valid code value), it activates an adaptive coding algorithm.

Transmissions from the satellite/wireless network are received and processed by a Satellite/Wireless frame processor 2502, which performs the inverse operation of that performed by the frame processor 2501, strips the Spackets from the frame format and produces the compressed and un-compressed Spackets.

Next, compressed Spackets are sent to Data Decompression module 2600, which decompresses the Spackets belonging to a VC which has been configured to be compressed. Compression and decompression histories are maintained in the Data compressor 2400 and the decompressor 2600, respectively. These histories are reset once every n Spackets, where n is a configurable parameter. This is done to minimize the effect that a lost or erroneous Spacket has on the following Spackets.

A reassembly and resequencing processor 2700 keeps track of Spackets belonging to all the VCs. The reassembly algorithm works on a per-VC basis. The Spackets for each VC are resequenced based on the sequence and packet numbers. The following rules are used to reassemble frame relay packets:

If a Spacket with a sequence number of zero is received, discard any previous incompletely assembled frame relay packet and start reassembling this new packet.

If a Spacket with the same packet number and VC Id, with a sequence number one more than the previous Spacket is received, then append this Spacket to the partially reassembled frame relay packet. If the "last field" indicates that the Spacket is the last Spacket of a frame relay packet, the frame relay packet has been completely assembled.

If a Spacket with sequence number which is out of sequence, and non-zero, is received, discard this new Spacket and any partially reassembled frame relay packet.

If the packet number of the Spacket received is not the same as that of the previous Spacket and the sequence number of the received Spacket is not zero, discard this new Spacket and any partially reassembled frame relay packet.

Optionally, a length field could be added to the frame relay packet at the transmitting terminal before it is segmented and transmitted over the satellite/wireless link. This length field could be used at the receiving terminal to check if the frame relay packet has been reassembled properly. If it hasn't then the frame relay packet is added to the transmit queue A transmit queue 2800 contains frame relay packets received from the remote terminal which will be transmitted over the terrestrial link. These packets are processed by the frame relay physical and data link layer processing module and transmitted over the terrestrial link.

Finally, the frame relay physical and data link layer processing module 2000 will reassemble the Spackets in to the appropriate frame relay configuration for transmission over the private or public network.

In order to save bandwidth, a header compression technique, similar to that used for ATM transmissions as described previously, may be used to compress the VC Id of a frame relay packet into a smaller value. This technique utilizes the fact that the number of VCs carried over the satellite/wireless link is not very large and can be compressed to a much smaller VC Id space. If header compression has been enabled in the system, then the VCs are mapped into a new value as specified by the size of the compressed VC field. This header compression information is periodically exchanged between the communicating terminals. Also, every time a new mapping is created, this information is asynchronously exchanged between the terminals before the actual transfer of the mapped packet begins.

While the present invention has been explained for a cell-based transmission system such as ATM and a packet-based transmission system such as frame-relay, its application to other cell/packet systems such as ISDN/SS#7 and Internet systems would be apparent to one of ordinary skill in the art as the protocols for these systems are established by industry standards and are well known in the art.

Although certain preferred embodiments of the present invention have been described, the spirit and scope of the invention is not restricted to that which is described above and it is the claims which are relied upon to define the present invention in accordance with applicable principles of law.

What is claimed is:

1. In an interconnect apparatus disposed between a terrestrial cell and/or packet switch at a first terminal and one or both of a satellite and wireless network connecting to a second terminal, a method for the adaptive control of a forward error correction code for transmission over a communication channel which connects said first terminal to said second terminal, said method comprising the steps of:

calculating a byte error rate associated with communication signals received by said first terminal via said communication channel from said second terminal;

determining a forward error correction code length of said forward error correction code based on said byte error rate, said forward error correction code length being varied in accordance with said byte error rate;

transmitting said forward error correction code length to said second terminal over said communication channel; and changing the forward error correction code at said first and second terminals in a synchronized manner without data loss.

2. The method of claim 1, wherein said step of calculating said byte error rate is performed at a predetermined interval based on said byte error rate.

3. The method of claim 2, wherein said byte error rate is calculated according to one of a plurality of formulas based on a prior byte error rate.

4. The method according to claim 1, wherein said steps of calculating and determining are performed only if said first terminal and said second terminal are synchronized.

5. The method according to claim 4, wherein if said first terminal and said second terminal are unsynchronized, said forward error correction code length transmitted to said remote interface will correspond to a predetermined maximum value thereof.

6. The method according to claim 1, wherein said forward error correction code is at least one of a Viterbi Code and a Reed-Solomon Code.

7. The method according to claim 1, wherein said forward error correction code length is transmitted in a predetermined communication signal over said communication channel.

8. The method according to claim 7, wherein said forward error correction code length is transmitted in a frame relay-based frame included in said predetermined communication signal.

9. The method according to claim 7, wherein said forward error correction code length is transmitted in an ISDN-based frame included in said predetermined communication signal.

10. The method according to claim 7, wherein said forward error correction code length is transmitted in an Internet-based frame included in said predetermined communication signal.

11. The method according to claim 7, wherein said forward error correction code length is transmitted in an ATM-based frame included in said predetermined communication signal.

12. The method according to claim 7, wherein said forward error correction code is a Reed-Solomon Code.

13. The method according to claim 7, wherein said forward error correction code is a Viterbi Code.

14. In an interconnection apparatus at a first terminal disposed between a cell and/or packet switch and one or both of a satellite and wireless communication network, an apparatus for the adaptive control of a forward error correction code for transmission over a communication channel which connects said first terminal to a second terminal, said apparatus comprising:

means for calculating a byte error rate associated with communication signals received by the first terminal via said communication channel from said second terminal;

means for determining a forward error correction code length of said forward error correction code based on said byte error rate, said forward error correction code length being varied in accordance with said byte error rate; and means for transmitting said forward error correction code length to the second terminal over said communication channel; whereby the forward error correction code at said first and second terminals may be changed in a synchronized manner without loss of data.

15. The apparatus according to claim 14, wherein said forward error correction code is at least one of a Viterbi Code and a Reed-Solomon Code.

16. The apparatus according to claim 14, wherein said forward error correction code length is transmitted in a predetermined communication signal over said communication channel, said predetermined communication signal being recognized by said first terminal and said second terminal.

17. The apparatus according to claim 16, wherein said forward error correction code length is transmitted in an ATM-based frame included in said predetermined communication signal.

18. The apparatus according to claim 16, wherein said forward error correction code length is transmitted in a frame relay-based frame included in said predetermined communication signal.

19. The apparatus according to claim 16, wherein said forward error correction code length is transmitted in an ISDN-based frame included in said predetermined communication signal.

20. The apparatus according to claim 16, wherein said forward error correction code length is transmitted in an Internet-based frame included in said predetermined communication signal.

* * * * *